United States Patent [19]

Komrska et al.

[11] Patent Number: 5,513,078
[45] Date of Patent: Apr. 30, 1996

[54] SHIELDED SWITCH

[75] Inventors: Dean M. Komrska, Buffalo Grove; Dale G. Johnson, Lake Zurich, both of Ill.

[73] Assignee: Motorola, Inc., Schaumburg, Ill.

[21] Appl. No.: 336,962

[22] Filed: Nov. 10, 1994

[51] Int. Cl.⁶ .................................................. H05K 9/00
[52] U.S. Cl. ........................... 361/816; 361/796; 361/814; 174/35 R; 200/305
[58] Field of Search ...................................... 361/752, 796, 361/800, 816, 814, 809; 174/35 R, 35 TS, 17 R; 341/22; 455/128, 349; 200/305; 257/659, 660

[56] References Cited

U.S. PATENT DOCUMENTS

| | | | |
|---|---|---|---|
| 4,555,600 | 11/1985 | Morse | 179/184 |
| 5,124,889 | 6/1992 | Humbert et al. | 361/424 |
| 5,241,695 | 8/1993 | Roshitsh et al. | 455/128 |
| 5,438,482 | 8/1995 | Nakamura et al. | 316/816 |

Primary Examiner—Leo P. Picard
Assistant Examiner—Y. Whang
Attorney, Agent, or Firm—Dale B. Halling; Donald C. Kordich

[57] ABSTRACT

An EMI shielded keypad (10) or switch for a radiotelephone (50) has a non-conductive cover (12) attached to a printed circuit board (PCB) (14). The PCB (14) has a ground pad (20) and a plurality of metal traces (26) on a first surface (16) that attaches to the cover (12). The cover (12) is made of a flexible, preferably clear material, such as mylar and has a dimple (28) centered over the ground pad (20). A bubble (30) is centered over the plurality of conductive traces (26). A conductive coating (32) is selectively applied to the mating surface (34) of the cover (12), so that the conductive coating (32) in the bubble (30) is electrically isolated. By pressing on the bubble (30) electrically contact is established between the plurality of traces (26), thus the bubble and the traces (26) define a switch.

12 Claims, 1 Drawing Sheet

SHIELDED SWITCH

FIELD OF THE INVENTION

The present invention relates generally to the field of radiotelephones and more generally to EMI shielding for radiotelephones.

BACKGROUND OF THE INVENTION

Electromagnetic interference (EMI) poses two concerns for radiotelephones. The first concern is EMI entering the radiotelephone circuitry and introducing noise, which can degrade signal reception and cause improper operation of the radiotelephone. The second concern is the amount of EMI emitted from the radiotelephone. All electronic products have to meet FCC regulations on the amount of EMI they can emit.

Generally, the approach to shielding from EMI is to provide a conductive, usually metal, enclosure either around the source of the EMI or around the electronic circuitry that is most susceptible to EMI. Often the conductive enclosure is grounded. In radiotelephones this usually means placing metal enclosures over EMI emitters and susceptible circuitry. However, this is usually not sufficient so the plastic housing holding the radiotelephone is coated with a metallic paint or covered with a metallic screen.

While the metal enclosures and metallized housings provide adequate EMI shielding, there is a constant drive to reduce the manufacturing costs of radiotelephones. The process of shielding the housings is relatively expensive. To avoid shielding the housing more metal enclosures can be used to cover the electronic circuitry. While this is less expensive than shielding the housing it provides an inadequate level of EMI shielding for the radiotelephone. Thus there exists a need for a less expensive way to provide EMI shielding in a radiotelephone.

DESCRIPTION OF THE PREFERRED EMBODIMENTS

Figure 1:
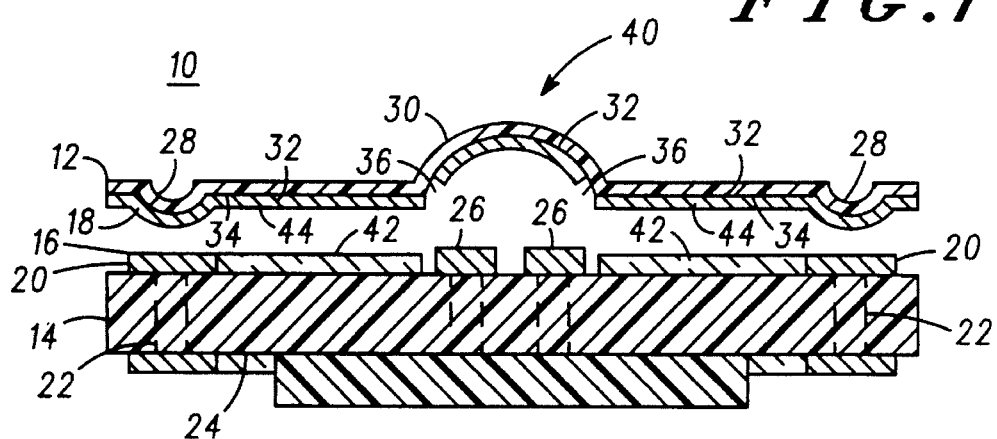
FIG. 1 is a cross section of a keypad circuit board.

A solution to providing cheaper EMI shielding involves combining the function of shielding with a keypad. FIG. I shows a cross section of a keypad 10 with EMI shielding. The keypad 10 has a cover 12 and a printed circuit board 14. The printed circuit board (PCB) 14 has a first surface 16 that abuts a mating surface 18 of the cover 12. The first surface 16 has a ground pad 20 connected to a conductive feed through 22 which electrically connects the ground pad 20 to PCB ground on the second surface 24. A plurality of exposed metal traces 26 define a switch contact, on the first surface of the PCB 14.

The cover 12 is made of a flexible material, such as mylar. The cover 12 has a dimple 28 centered over the ground pad 20 to assure electrical contact. A convex bubble or dome 30 in the cover 12 is centered over the plurality of metal traces 26. A conductive coating 32, preferably silver, is stenciled onto a mating surface 34 of the cover 12 which attaches to the first surface 16 of the PCB 14.

The conductive coating 32 is applied selectively so that there is a gap 36 in the coating 32 to provide electrical isolation of the bubble 30. This electrically isolated bubble makes up a second contact of a switch 40. When pressure is applied to the bubble 30 the conductive coating 32 makes electrical contact with the plurality of traces 26, thus closing the switch 40. Upon release the bubble 30 rebounds to its non-contact position, (as shown if FIG. 1) thus opening the switch 40. The bubble 30 is about the size of a fingertip which is the intended object to provide pressure. By placing a number of these switches on the PCB 14 and cover 12 you can make a keypad. Normally, the keypad 10 has a rubber template over the cover 12 and LEDs on the PCB 14. The template has the numerals written in a light color and the light from the LEDs is dispersed by the translucent rubber template to light up the numerals.

Often the PCB 14 has a solder mask (non-conductive coating) 42 which electrically isolates other conductive traces from the conductive coating 32. The cover 12 can be attached to the PCB 14 by a number of methods including mechanical fasteners, pressure fit and an adhesive or an adherent 44. The adhesive 44 can be applied to the conductive coating 32, except under the bubble 30 and dimple 28 or a conductive adhesive 44 could replace the conductive coating 32, except bubble 30. On the other hand, a non-conductive adhesive 44 applied everywhere except under the dimple 28 and bubble 30 could replace the solder mask 42.

The structure of FIG. 1 provides a grounded conductive plane across the entire keypad 10 expect for the bubbles 30. This results is an effective, low cost, EMI shield for the circuitry covered by the keypad 10.

Figure 2:
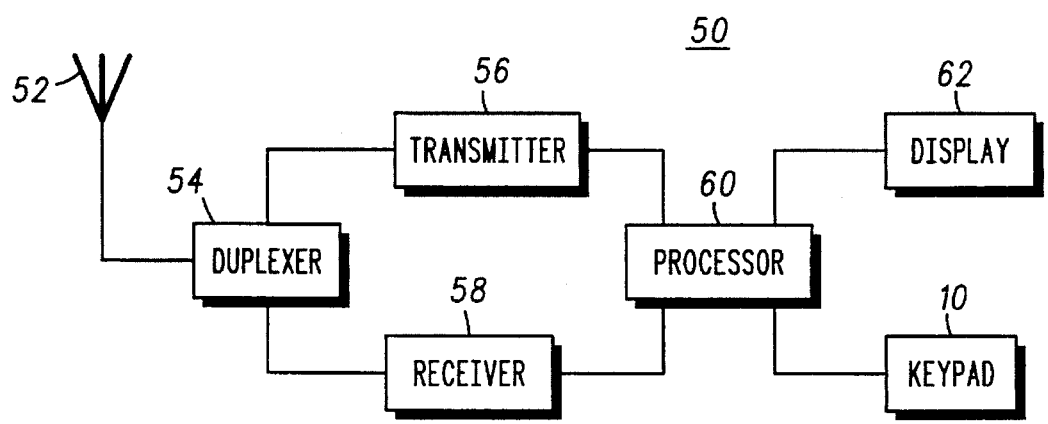
FIG. 2 is a block diagram of a radiotelephone.

The keypad 10 of FIG. I could be used with a wide variety of electronic instruments, such as telephones, fax machines, calculators, personal digital assistants, etc. The block diagram of FIG. 2 shows a radio telephone 50, in which the keypad 10 of FIG. 1 may be advantageously used. The radiotelephone 50 has an antenna 52 connected to a duplexer 54. The duplexer 54 isolates the energy from a transmitter 56 and a receiver 58. A processor 60 controls the transmitter 56, the receiver 58, a display 62 and the keypad 10 of FIG. 1. The EMI shielded keypad 10 provides EMI protection for the radiotelephone 50 circuitry designated by the processor 60, the transmitter 56, the receiver 58 and the duplexer 54 blocks.

Figure 3:
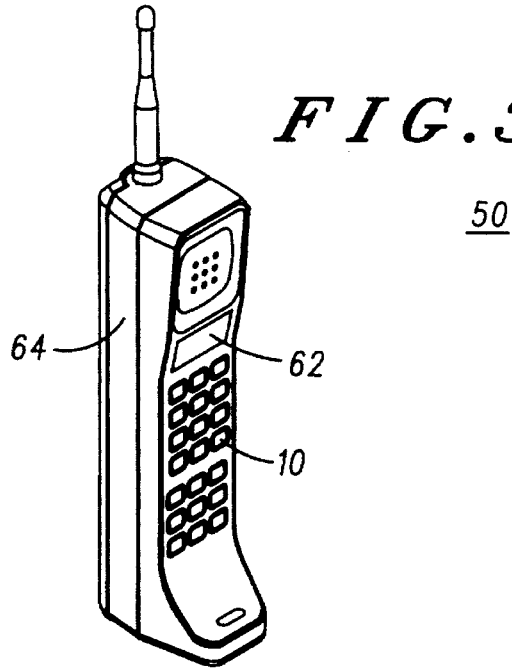
FIG. 3 is a top left perspective view of a radiotelephone.

FIG. 3 shows a perspective view of a radiotelephone 50 with the EMI shielded keypad 10. When the keypad 10 is used with metal enclosures over the most sensitive circuitry, it provides a low cost effective EMI solution for the radiotelephone 50. When compared to the conventional solution of metallizing the housing 64 of the radiotelephone 50 and metal enclosures over the sensitive circuitry, this solution provides a significant reduction in the cost of shielding the radio.

A number of modification could be made by those skilled in the art without departing from the scope of the invention. For instance, the dimple 28 may be eliminated by wrapping the cover 12 around circuit board 14. The dome 30 may be flexible metal dome adhered to the mating surface 18 of the cover 12. Finally, the cover 12 may be attached to the PCB 14 by a number of methods, such as soldering, spot welding, mechanical fit and others.

What is claimed is:

1. An EMI shielded keypad comprising:

a printed circuit board including a first surface and a plurality of metal traces on the first surface; and a cover attached to the first surface of the printed circuit board, the cover including, a flexible, non-conductive, essentially planar surface having an attaching face;

a dome formed in the planar surface, convex relative the first surface, and centered over the plurality of metal traces; and a conductive coating selectively applied on the attaching face of the planar surface such that a gap is provided in the conductive coating to provide electrical isolation of the portion of the conductive coating on the dome;

whereby pressing the dome towards the plurality of metal traces causes electrical coupling between the plurality of metal traces via the portion of the conductive coating on the dome coming into contact with the plurality of metal traces.

2. The EMI shielded keypad of claim 1, wherein the printed circuit board further including a non-conductive coating selectively applied to the first surface for electrically isolating other metal traces on the first surface from the conductive coating.

3. The EMI shielded keypad of claim 2, wherein the non-conductive coating is formed by a solder mask.

4. The EMI shielded keypad of claim 1, wherein an adhesive is used to attach the cover to the printed circuit board.

5. The EMI shielded keypad of claim 1, wherein the printed circuit board further including a ground pad on the first surface, wherein the conductive coating is electrically coupled with the ground pad except for the conductive coating under the dome.

6. The EMI shielded keypad of claim 5, wherein the cover further including a dimple formed in the planar surface and, convex relative the first surface to electrically couple the conductive coating with the ground pad except for the conductive coating under the dome.

7. An EMI shielded keypad comprising:

a printed circuit board, comprising:

a plurality of metal traces having an exposed portion on a first surface of said printed circuit board; and a ground pad on the first surface of the printed circuit board; and a cover attached to the first surface of the printed circuit board said cover comprising;

a flexible non-conductive essentially planar surface having an attaching face;

a dome centered over the exposed portion of said plurality of metal traces; and a conductive coating on the attaching face of the planar surface, wherein the conductive coating is silver, said conductive coating contacting the ground pad;

whereby pressing the dome onto the plurality of metal traces causes electrical conduction between the traces.

8. A radiotelephone having a receiver, a transmitter, an antenna connected to the receiver and the transmitter, and a processor controlling the radiotelephone, said radiotelephone comprising:

a rectangular housing;

a visual display on one surface of said housing controlled by said processor; and a EMI shielded keypad on said one surface of said housing controlled by said processor, wherein said EMI Shielded keypad comprises, a printed circuit board having a plurality of exposed conductors, a flexible non-conductive cover attached to the printed circuit board said cover having a bubble over the plurality of exposed conductors and Said cover having a conductive coating on the surface adjacent the printed circuit board, wherein the conductive coating is selectively applied to the bubble and the bubble is electrically isolated from the rest of the conductive coating.

9. The radiotelephone of claim 8, wherein the conductive coating is an adhesive for holding the cover onto the printed circuit board.

10. The radiotelephone of claim 8, wherein the printed circuit board further has a ground pad that makes electrical contact with the conductive coating on the cover.

11. A radiotelephone having a receiver, a transmitter, an antenna connected to the receiver and the transmitter, and a processor controlling the radiotelephone, said radiotelephone comprising:

a rectangular housing;

a visual display on one surface of said housing controlled by said processor; and a EMI shielded keypad on said one surface of said housing controlled by said processor, wherein said EMI shielded keypad comprises, a printed circuit board having a plurality of exposed conductors, a flexible non-conductive cover attached to the printed circuit board, said cover having a bubble over the plurality of exposed conductors and said cover having a conductive coating on the surface adjacent the printed circuit board, wherein the conductive coating is silver.

12. The radiotelephone of claim 11, further including a non-conductive adhesive for holding the cover onto the printed circuit board.

* * * * *